(12) United States Patent
Im et al.

(10) Patent No.: US 7,839,200 B2
(45) Date of Patent: Nov. 23, 2010

(54) SEMICONDUCTOR DEVICE AND DATA OUTPUTTING METHOD OF THE SAME

(75) Inventors: Jae-Hyuk Im, Kyoungki-Do (KR); Kee-Teok Park, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 52 days.

(21) Appl. No.: 12/130,666

(22) Filed: May 30, 2008

(65) Prior Publication Data

US 2009/0167413 A1   Jul. 2, 2009

(30) Foreign Application Priority Data

Dec. 26, 2007   (KR) ...................... 10-2007-0137401

(51) Int. Cl.
*G05F 1/10*   (2006.01)
(52) U.S. Cl. ...................... 327/512; 327/513; 327/170; 327/175
(58) Field of Classification Search ........................ None
See application file for complete search history.

(56) References Cited

U.S. PATENT DOCUMENTS

| | | | | |
|---|---|---|---|---|
| 5,291,071 A | * | 3/1994 | Allen et al. ................. | 327/108 |
| 6,366,153 B1 | * | 4/2002 | Arslain et al. ............... | 327/512 |
| 6,646,483 B2 | * | 11/2003 | Shin ........................... | 327/112 |
| 6,894,547 B2 | * | 5/2005 | Takahashi ................... | 327/170 |
| 2007/0252638 A1 | * | 11/2007 | Aquil et al. ................. | 327/513 |

FOREIGN PATENT DOCUMENTS

| | | |
|---|---|---|
| KR | 1020000055937 A | 9/2000 |
| KR | 1020050088862 A | 9/2005 |
| KR | 1020060122193 A | 11/2006 |
| KR | 100668515 B1 | 1/2007 |

OTHER PUBLICATIONS

Notice of Allowance issued from Korean Intellectual Property Office on Mar. 9, 2009 with an English Translation.

* cited by examiner

*Primary Examiner*—An T Luu
(74) *Attorney, Agent, or Firm*—IP & T Group LLP

(57) ABSTRACT

Semiconductor device and data outputting method of the same includes an on die thermal sensor (ODTS) configured to output temperature information by detecting an internal temperature of the semiconductor device and an output driver configured to control a slew rate depending on the temperature information and output data.

19 Claims, 9 Drawing Sheets

SEMICONDUCTOR DEVICE AND DATA OUTPUTTING METHOD OF THE SAME

CROSS-REFERENCE TO RELATED APPLICATIONS

The present invention claims priority of Korean patent application number 10-2007-0137401, filed on Dec. 26, 2007, which is incorporated by reference in its entirety.

BACKGROUND OF THE INVENTION

The present invention relates to a technology for controlling a slew rate of an output driver for outputting data or signals, depending on a temperature in any of a variety of semiconductor devices such as a semiconductor memory device.

An output driver serves to output data or signals to the outside of a chip in any of a variety of semiconductor devices such as a semiconductor memory device or the like.

FIG. 1 is a block diagram of an output driver of a conventional semiconductor device.

Referring to FIG. 1, an output driver includes a pre-driver 110 and a main driver 120.

The pre-driver 110 generates at least one driving control signal for driving a main driver 120 in accordance with a logic level of data DATA that will be output by the output driver. The pre-driver 110 generates two driving control signals: a pull-up driving control signal UP_PRE that controls the main driver 120 such that the main driver 120 pulls up an input/output node DQ and a pull-down driving control signal DN_PRE that controls the main driver 120, such that the main driver 323 pulls down the input/output node DQ. The drain and supply voltages are denoted by VDDQ and VSSQ respectively.

The pull-up driving control signal UP_PRE is activated when the data DATA that will be output by the output driver has a logic high level so that the main driver 120 outputs the data DATA having the logic high level by pulling up the input/output node DQ. Since a pull-up driver 121 of the main driver 120 is generally implanted with a P-channel metal oxide semiconductor (PMOS) transistor, the activation of the pull-up driving control signal UP_PRE means that the pull-up driving control signal UP_PRE is at a logic low level.

The pull-down driving control signal DN_PRE is activated when the data DATA that will be output by the output driver has a logic low level so that the main driver 120 outputs the data having the logic low level by pulling down the input/output node DQ. Since a pull-down driver 122 of the main driver 120 is generally implemented with an N-channel metal oxide semiconductor (NMOS) transistor, the activation of the pull-down driving control signal UP_PRE means that the pull-down driving control signal UP_PRE is at a logic high level.

When the data having the logic high level are output, the pre-driver 110 activates the pull-up driving control signal UP_PRE to the logic low level and deactivates the pull-down driving control signal DN_PRE to the logic low level. When the data having the logic low level is output, the pre-driver 110 deactivates the pull-up driving control signal UP_PRE to the logic high level and activates the pull-down driving signal DN_PRE to the logic high level. When no data is output, the pre-driver 110 deactivates the pull-up driving control signal UP_PRE to the logic high level and deactivates the pull-down driving control signal DN_PRE to the logic low level to allow the input/output node DQ to be in a high state.

The main driver 120 outputs the data having a logic high or low level by pulling up or pulling down the input/output node DQ in response to the driving control signals UP_PRE and DN_PRE. In more detail, when the pull-up driving control signal UP_PRE is activated, the main driver 120 pulls up the input/output node DQ to output the data having the logic high level. When the pull-down driving control signal DN_PRE is activated, the main driver 120 pulls down the input/output node DQ to output the data having the logic low level. Although each of the pull-up and pull-down drivers 121 and 122 implemented with one transistor is illustrated in FIG. 1, the main driver 120 may include a plurality of transistors connected in parallel.

A slew rate is an amount of a voltage that changes per hour, i.e., a gradient of a voltage change. The slow rate is an important value in an input/output circuit such as the output driver. In order to stably output the data to the outside of the chip, the output driver has to have a uniform slew rate.

When a temperature of the semiconductor device is varied, properties of a variety of transistors and a variety of delay circuits in the chip are varied. Generally, when the temperature increases, the slew rate is reduced.

FIG. 2 is a schematic diagram illustrating a variation of a slew rate at the output node DQ of the output driver of FIG. 1 and a size variation of a data window.

The upper side of FIG. 2 illustrates a slew rate and data window at a normal temperature and the lower side of FIG. 2 illustrates a slew rate and data window at a high temperature.

When comparing the upper and lower sides of FIG. 2, the slew rate (gradient) of the output driver is low at the high temperature compared with at the normal temperature. Therefore, a valid data window is reduced at the high temperature.

When the valid data window is reduced, it is difficult to recognize the data output from the output driver at an external side of the chip.

SUMMARY OF THE INVENTION

Embodiments of the present invention are directed to providing a semiconductor device including an output driver that can control its own slew rate depending on a temperature.

In accordance with an aspect of the invention, there is provided an on die thermal sensor (ODTS) configured to output temperature information by detecting an internal temperature of the semiconductor device and an output driver configured to control a slew rate depending on the temperature information and output data. In accordance with another aspect of the invention, there is provided an ODTS configured to detect an internal temperature of the semiconductor device and output temperature information and an output driver configured to receive the temperature information, control a slew rate such that the slew rate increases in proportion or inverse proportion to the temperature in accordance with setting information, and outputting data. In accordance with another aspect of the invention, there is provided a step of generating temperature information by detecting an internal temperature of the semiconductor device and outputting data, generating at least one driving control signal in accordance with a logic level of the data, controlling a rising/falling property of the driving control signal depending on the temperature information and pulling up or pulling down an input/output node in response to the driving control signal whose rising/falling property is controlled

DESCRIPTION OF SPECIFIC EMBODIMENTS

Hereinafter, a semiconductor device and a data outputting method thereof in accordance with the present invention will be described in detail with reference to the accompanying drawings.

Figure 1:
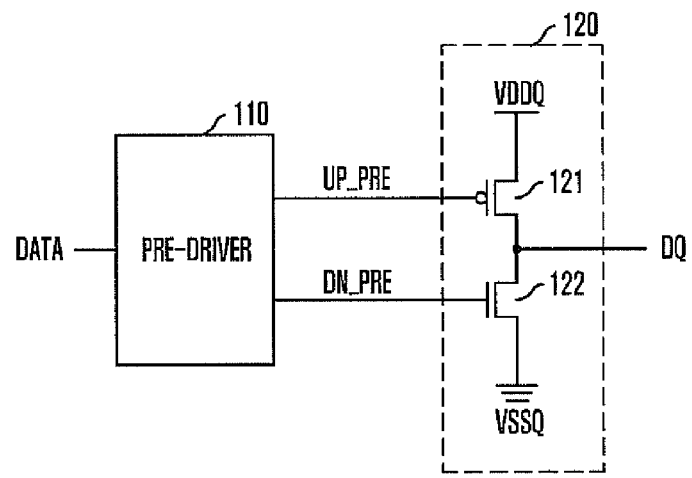
FIG. 1 is a block diagram of an output driver of a conventional semiconductor device.
Figure 2:
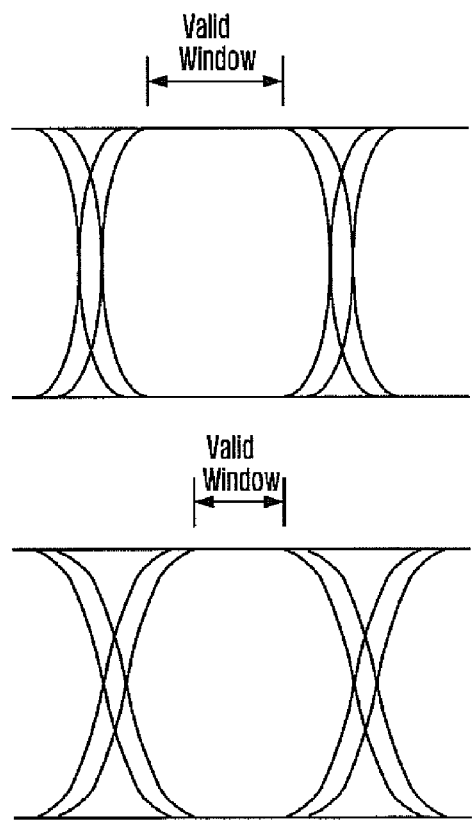
FIG. 2 is a schematic diagram illustrating a variation of a slew rate at an output node (DQ) of the output driver of FIG. 1 and a size variation of a data window.
Figure 3:
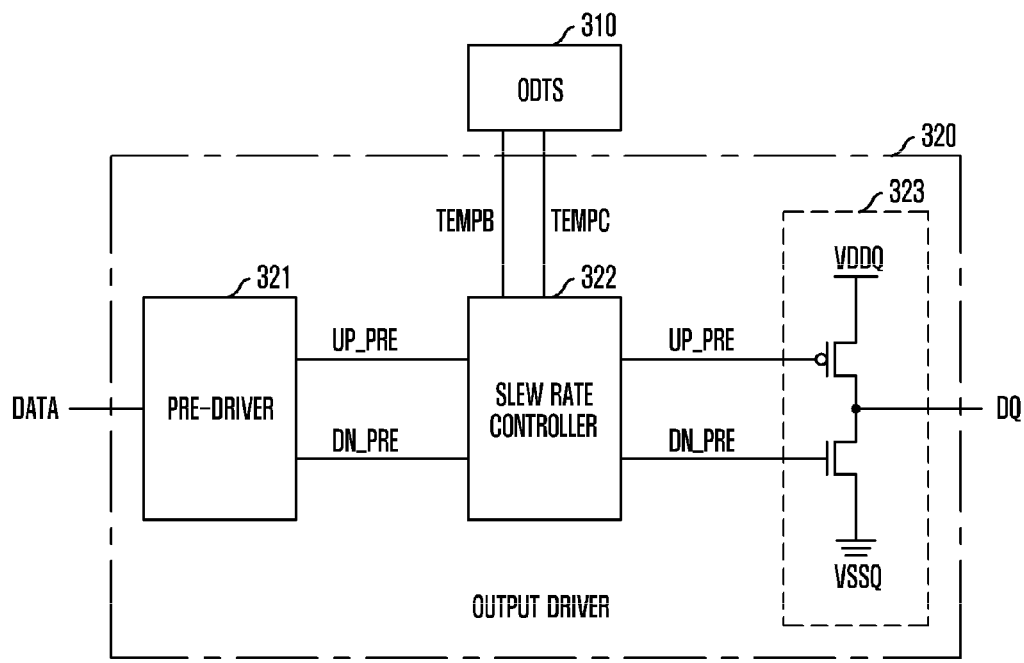
FIG. 3 is a block diagram of a semiconductor device in accordance with an embodiment of the present invention.

FIG. 3 is a block diagram of a semiconductor device in accordance with an embodiment of the invention.

A semiconductor device in accordance with an embodiment of the invention includes an ODTS 310 and an output driver 320. The ODTS 310 detects an internal temperature of the semiconductor device and outputs temperature information TEMPB and TEMPC. The ODTS 310 will be described later in more detail with reference to FIG. 4.

The output driver 320 controls a slew rate depending on the temperature information TEMPB and TEMPC and outputs data DATA. In the present disclosure, data means information (signals or data) output from the output driver 320. The output driver 320 may control the slew rate such that the slew rate increases in proportion or in inverse proportion to the internal temperature and outputs the data DATA.

When the output driver 320 is designed to control its own slew rate such that the slew rate increases in proportion to the internal temperature, the output driver 32 controls its own slew rate such that the slew rate increases even when the slew rate is lowered due to the property degradation at a high temperature. Therefore, the output driver 320 can stably output the data DATA with a uniform slew rate.

When the output driver 320 is designed to control its own slew rate such that the slew rate increases in inverse proportion to the internal temperature, the slew rate is lowered with the increase of the temperature. That is, current consumption of the semiconductor device increases when the temperature increases. Therefore, by lowering the slew rate as the temperature increases, the current consumption can be reduced.

The output driver 320 includes a pre-driver 321 for generating one or more driving control signals in accordance with a logic level of the data DATA that will be output from the output driver 320, a slew rate controller 322 for controlling rising/falling properties of the driving control signals depending on the temperature information TEMPB and TEMPC, and a main driver 323 for outputting data in response to the driving control signals.

The pre-driver 321 generates the one or more driving control signals for driving the main driver 323 in accordance with the logic level of the data DATA that will be output. Generally, the pre-driver 321 generates two driving control signals: a pull-up driving control signal UP_PRE that controls the main driver 323 such that the main driver 323 pulls up an input/output node DQ (i.e., such that the main driver 323 outputs logic high data) and a pull-down driving control signal DN_PRE that controls the main driver 323 such that the main driver 323 pulls down the input/output node DQ (i.e., such that the main driver 323 outputs logic low data). Since the pre-driver 321 has been already described in "BACKGROUND OF THE INVENTION" in detail, a detailed description thereof will be omitted herein.

The rising/falling properties of the driving control signals UP_PRE and DN_PRE are controlled by the slew rate controller 322. The main driver 323 outputs the data in response to the driving control signals UP_PRE and DN_PRE. That is, when the pull-up driving control signal UP_PRE is activated, the main driver 323 outputs the data having a logic high level by pulling up the input/output node DQ. When the pull-down driving control signal is activated, the main driver 323 outputs the data having a logic low level by pulling down the input/output node DQ.

The slew rate controller 322 controls the slew rate of the output driver 320, i.e., the slew rate of the data from the main driver 323, by controlling the rising/falling properties of the driving control signals UP_PRE and DN_PRE from the pre-driver 321. Since the main driver 323 pulls up or pulls down the input/output node DQ in response to the driving control signals UP_PRE and DN_PRE, the slew rate may be varied by varying the rising/falling properties of the driving control signals UP_PRE and DN_PRE.

The rising/falling properties of the driving control signals UP_PRE and DN_PRE may be varied by varying delay values of the driving control signals UP_PRE and DN_PRE or varying a drivability of the driving control signals UP_PRE and DN_PRE. This will be described in more detail later with reference to the accompanying drawings.

Figure 4:
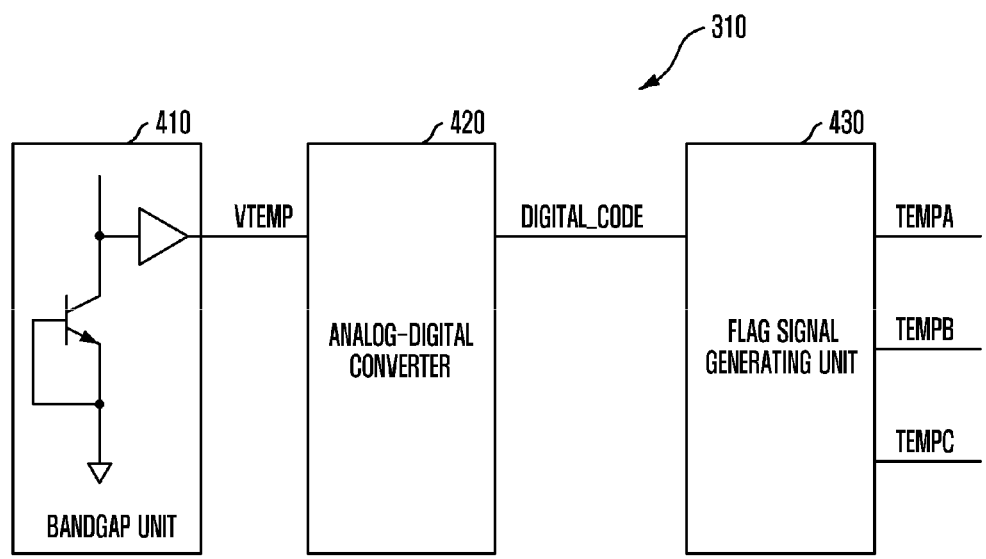
FIG. 4 is a block diagram of an ODTS of FIG. 3.

FIG. 4 is a block diagram of the ODTS 310 of FIG. 3.

The ODTS 310 includes a bandgap unit 410 outputting a voltage VTEMP exactly corresponding to the temperature, an analog-to-digital converter 420 converting the voltage VTEMP output from the bandgap unit 410 into a digital code DIGITAL_CODE and a flag signal generating unit 430 receiving the digital code DIGITAL_CODE from the analog-to-digital converter 420 and generating a plurality of flag signals TEMPA, TEMPB and TEMPC that are activated at a specific temperature.

The bandgap unit 410 detects the temperature using a bandgap circuit that is not affected by a temperature or power voltage and has a variation rate (−1.8 mV/□) at a base-emitter (VBe) of a bipolar junction transistor (BJT) and outputs the voltage VTEMP exactly corresponding to the temperature by amplifying the base-emitter voltage VBe of the BIT.

The analog-to-digital converter 420 converts the voltage output from the bandgap unit 410 into the digital code DIGITAL_CODE and outputs the converted digital code DIGITAL_CODE. A tracking analog-to-digital converter may be used as the analog-to-digital converter 420.

The flag signal generating unit 430 decodes the digital code DIGITAL_CODE to output the plurality of flag signals TEMPA, TEMPB and TEMPC representing respective temperature sections.

Figure 5:
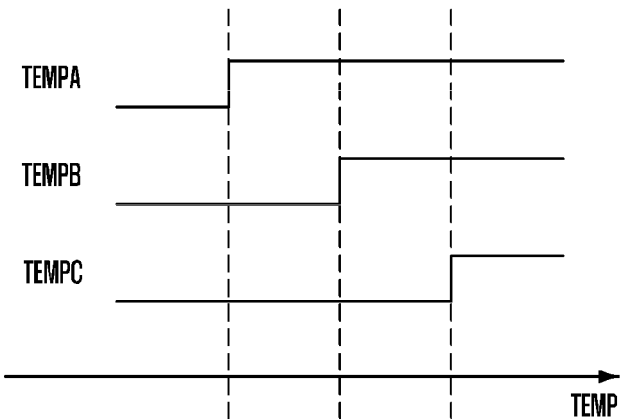
FIG. 5 is a schematic diagram illustrating an activation timing of flag signals.

Each of the flag signals TEMPA, TEMPB and TEMPC is activated when the temperature is equal to or greater than a predetermined level. For example, the flag signals TEMPA may be activated at a temperature of 40° C. or more, the flag signals TEMPB may be activated at a temperature of 60° C. or more, and the flag signals TEMPC may be activated at a temperature of 85° C. FIG. 5 illustrates activation timings of the flag signals TEMPA, TEMPB and TEMPC. The flag signals TEMPA, TEMPB and TEMPC are sequentially activated as the temperature increases along the TEMP axis. Therefore, all the flag signals TEMPA, TEMPB and TEMPC have the logic low level at the lowest temperature section and all the flag signals TEMPA, TEMPB and TEMPC have the logic high level at the highest temperature section.

The flag signals (temperature information) TEMPA, TEMPB and TEMPC of the ODTS have been used to control a refresh period of a memory unit depending on a temperature.

Although the output driver 320 uses two flag signals TEMPB and TEMPC as the temperature information, the invention is not limited to this embodiment. That is, the output driver 3200 may use one, three, or four flag signals.

Figure 6:
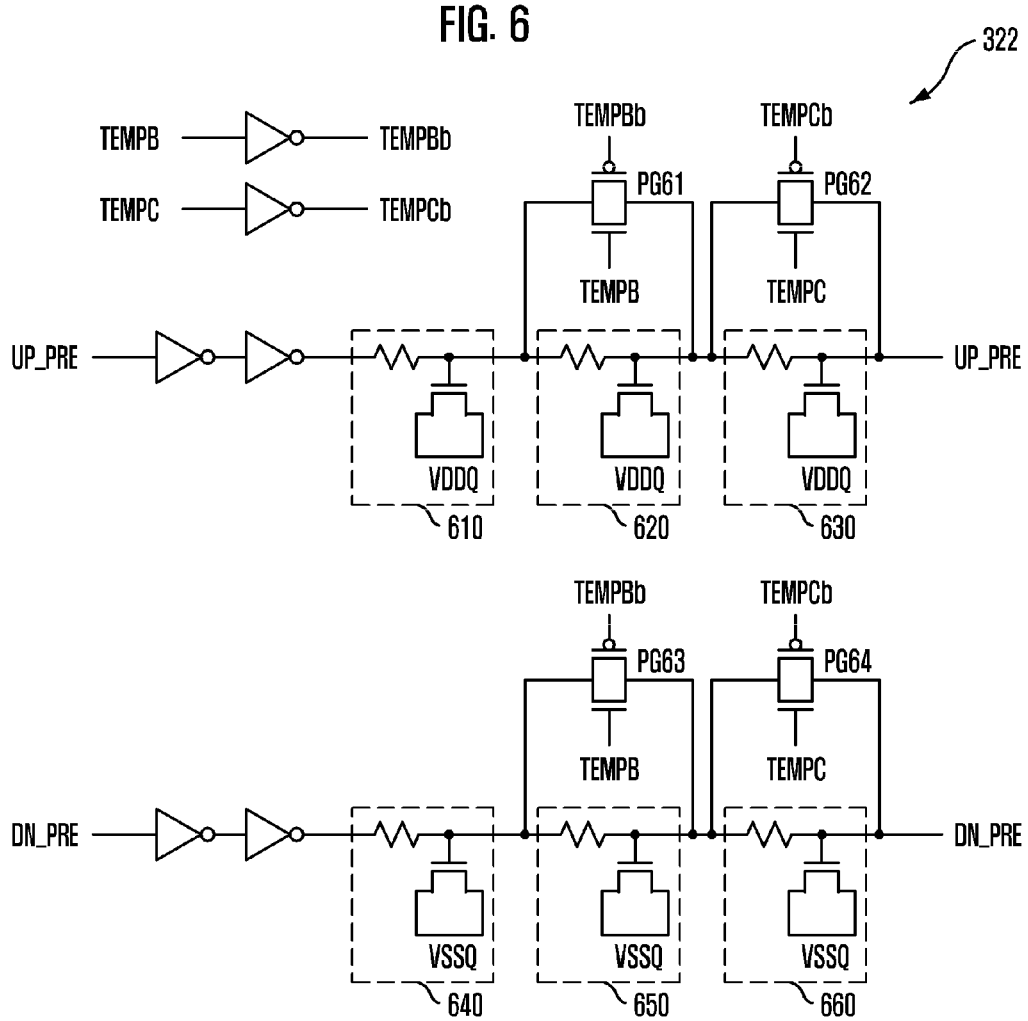
FIG. 6 is a circuit diagram of a slew rate controller of FIG. 3.

FIG. 6 is a circuit diagram of the slew rate controller 322 of FIG. 3.

FIG. 6 illustrates a case where the slew rate controller 322 controls the rising/falling properties of the driving control signals UP_PRE and DN_PRE by controlling the delay values of the driving control signals UP_PRE and DN_PRE. As shown in FIG. 6, the slew controller 322 includes one or more delay units 610, 620, 630, 640, 650 and 660 and the number of the delay units through which the driving control signals UP_PRE and DN_PRE pass is controlled depending on the temperature information TEMPB and TEMPC. Since the slew rate controller 322 may be designed such that the driving control signals do not pass through the delay unit 610, 620, 630, 640, 650 and 660 when the temperature is relatively high, the number of the delay units through which the driving control signals UP_PRE and DN_PRE pass may include 0 (in FIG. 6, the slew rate controller 322 is designed such that the driving control signals pass through at least one delay unit).

As shown in FIG. 6, each of the delay units 610, 620, 630, 640, 650 and 660 includes a resistor and a capacitor and delays the driving control signals UP_PRE and DN_PRE using a resistance-capacitance (RC) delay.

In operation, when the temperature decreases such that both the flag signals TEMPB having the logic low level, the driving control signals UP_PRE and DN_PRE are delayed while respectively passing through three delay units 610, 620 and 630, and 640, 650 and 660. When the temperature increases such that the flag signals TEMPB and TMPC respectively have the logic high level and the logic low level, pass gates PG61 and PG63 are turned on to allow the driving control signals UP_PRE and DN_PRE to respectively pass through two delay units 610 and 630, 640 and 660. When the temperature further increases such that both the flag signals TEMPB have the logic high level, all pass gates PG61, PG62, PG63 and PG64 are turned on to allow the driving control signals UP_PRE and DN_PRE to respectively pass through the delay units 610 and 640.

In the embodiment of FIG. 6, the delay values of the driving control signals UP_PRE and DN_PRE are gradually reduced as the temperature increases. As the delay values are reduced, the transition of the driving control signals UP_PRE and DN_PRE from the logic high level to the logic low level or from the logic low level to the logic high level becomes faster. As a result, the slew rate of the main driver 323 increases.

That is, the slew rate controller 322 of FIG. 6 operates such that it can increase the slew rate of the main driver 323 as the temperature increases.

Figure 7:
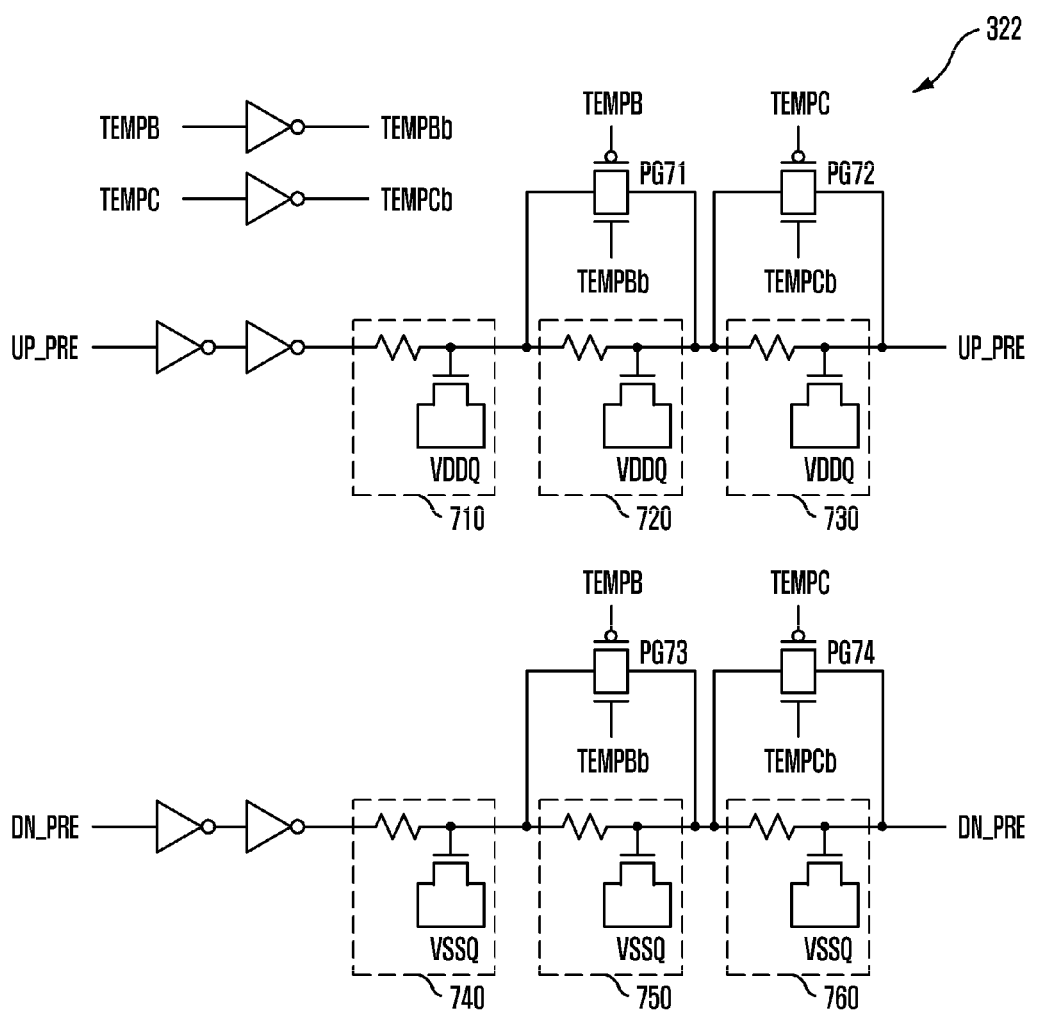
FIG. 7 is a circuit diagram of a modified example of the slew rate controller of FIG. 6.

FIG. 7 is a circuit diagram of a modified example of the slew rate controller 322 of FIG. 6.

Like the slew rate controller of FIG. 6, a slew rate controller of FIG. 7 is designed to control the rising/falling properties of the driving control signals UP_PRE and DN_PRE. However, while the slew rate controller of FIG. 6 increases the slew rate of the main driver 323 as the temperature increases, the slew rate controller of FIG. 7 lowers the slew rate of the main driver 323 as the temperature increases.

Therefore, in the slew rate controller 322 of FIG. 7, the number of delay units through which the driving control signals UP_PRE and DN_PRE pass increases as the temperature increases. To this end, the flag signals (temperature information) TEMPB and TEMPC are inversely input to pass gates PG71, PG72, PG73 and PG74 of the slew rate controller of FIG. 7 when compared with the slew rate controller 322 of FIG. 6.

Since the structure and operation of the slew rate controller of FIG. 7 are similar to those of the slew rate controller of FIG. 6 except for the above, the detailed description thereof will be omitted herein.

Figure 8:
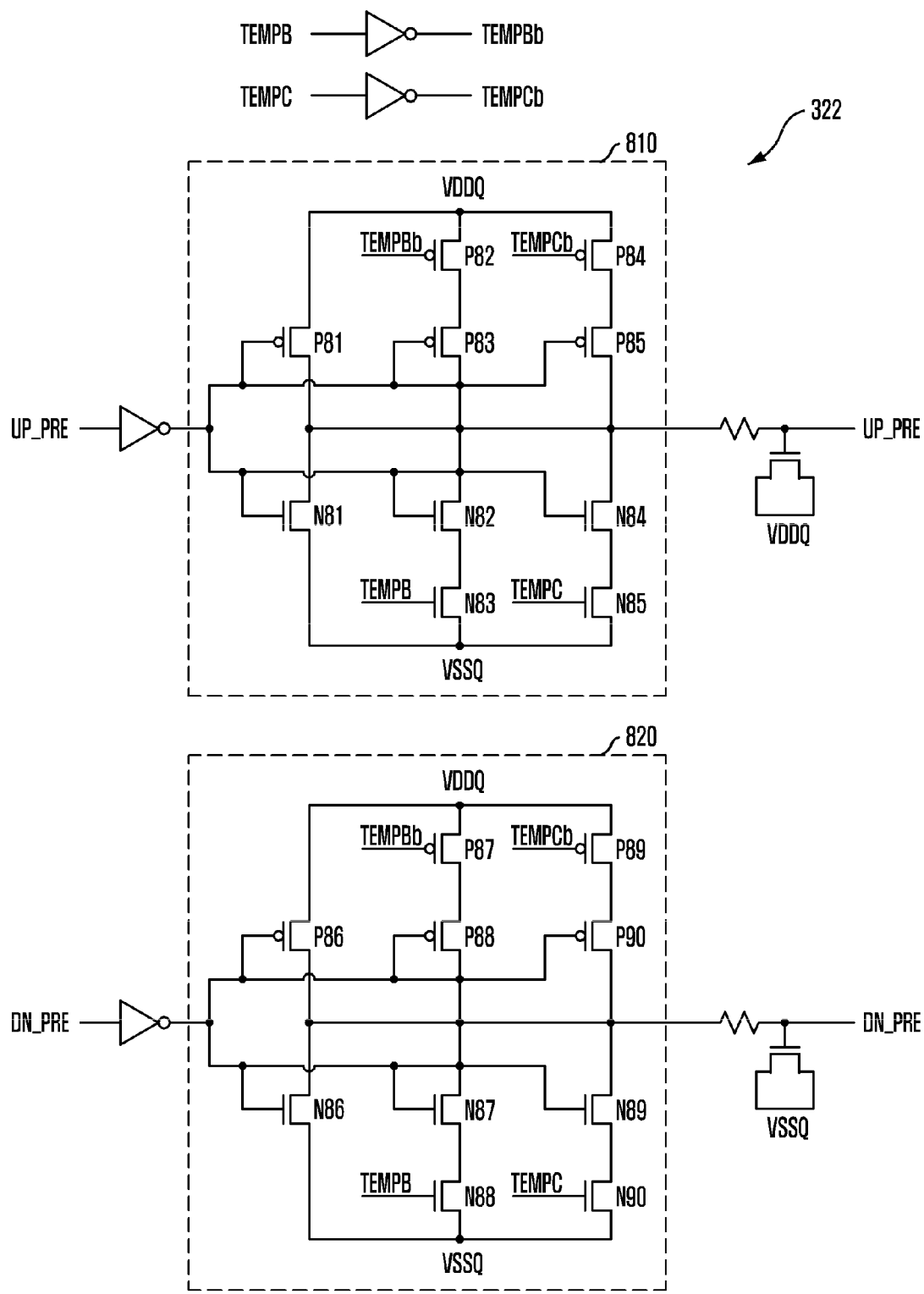
FIG. 8 is a circuit diagram of another modified example of the slew rate controller of FIG. 6.

FIG. 8 is a circuit diagram of another modified example of the slew rate controller 322 of FIG. 6.

A slew rate controller of FIG. 8 is designed to control the rising/falling properties of the driving control signals UP_PRE and DN_PRE by controlling a drivability of the driving control signals UP_PRE and DN_PRE.

As shown in FIG. 8, the slow rate controller includes one or more logic gates 810 and 820 through which the driving control signals UP_PRE and DN_PRE pass. The drivability of the logic gates 810 and 820 is controlled by the flag signals (temperature information) TEMPB and TEMPC. In FIG. 8, inverters are exemplarily illustrated as the logic gates 810 and 820.

In more detail, each of the inverters 810 and 820 includes a plurality of transistors P81-P90, N81-N90 that are connected in parallel. The number of the transistors used is determined depending on the temperature information TEMPB and TEMPC to control the drivability of the driving control signals UP_PRE and DN_PRE.

In operation, when the temperature decreases such that both the flag signals (temperature information) TEMPB and TEMPC have the logic low level, all the transistors P82, P84, P88, P90, N82, N85, N88 and N90 are turned off. Therefore, the driving control signal UP_PRE is pulled up or pulled down by the transistors P81 and N81 in the respective inverters 810 and 820 and the driving control signal DN_PRE is pulled up or pulled down by the transistors P86 and N86 in the respective inverters 810 and 820. When the temperature increases such that the flag signals (temperature information) TEMPB and TEMPC respectively have the logic high level and the logic low level, the transistors P82, P87, N83 and N88 are turned on. Therefore, the driving control signal UP_PRE is pulled up or pulled down by two transistors P81 and P83, N81 and N82, P81 and N81 in the respective inverters 810 and 820 and the driving control signal DN_PRE is pulled up or pulled down by two transistors P86 and P88, N86 and N87 in the respective inverters 810 and 820. That is, the drivability increases. When the temperature further increases such that both the flag signals (temperature information) TEMPB and TEMPC have the logic high level, all the transistors P82, P84, P88, P90, N82, N85, N88 and N90 are turned on. Therefore, the driving control signal UP_PRE is pulled up or pulled down by three transistors P81, P83 and P85, and N81, N82 and N84 in the respective inverters 810 and 820 and the driving control signal DN_PRE is pulled up or pulled down by three transistors P86, P88 and P90, and N86, N87 and N89 in the respective inverters 810 and 820. Therefore, the drivability increases to the highest level.

When the temperature increases to increase the drivability of the driving control signals UP_PRE and DN_PRE driving the main driver 323, the rising/falling speed of the driving control signals UP_PRE and DN_PRE increases and thus the turn on/off speed of the main driver 323 increases. Therefore, the slew rate of the main driver 323 increases. That is, the slew rate controller 322 of FIG. 8 increases the slew rate of the main driver 323 as the temperature increases.

Figure 9:
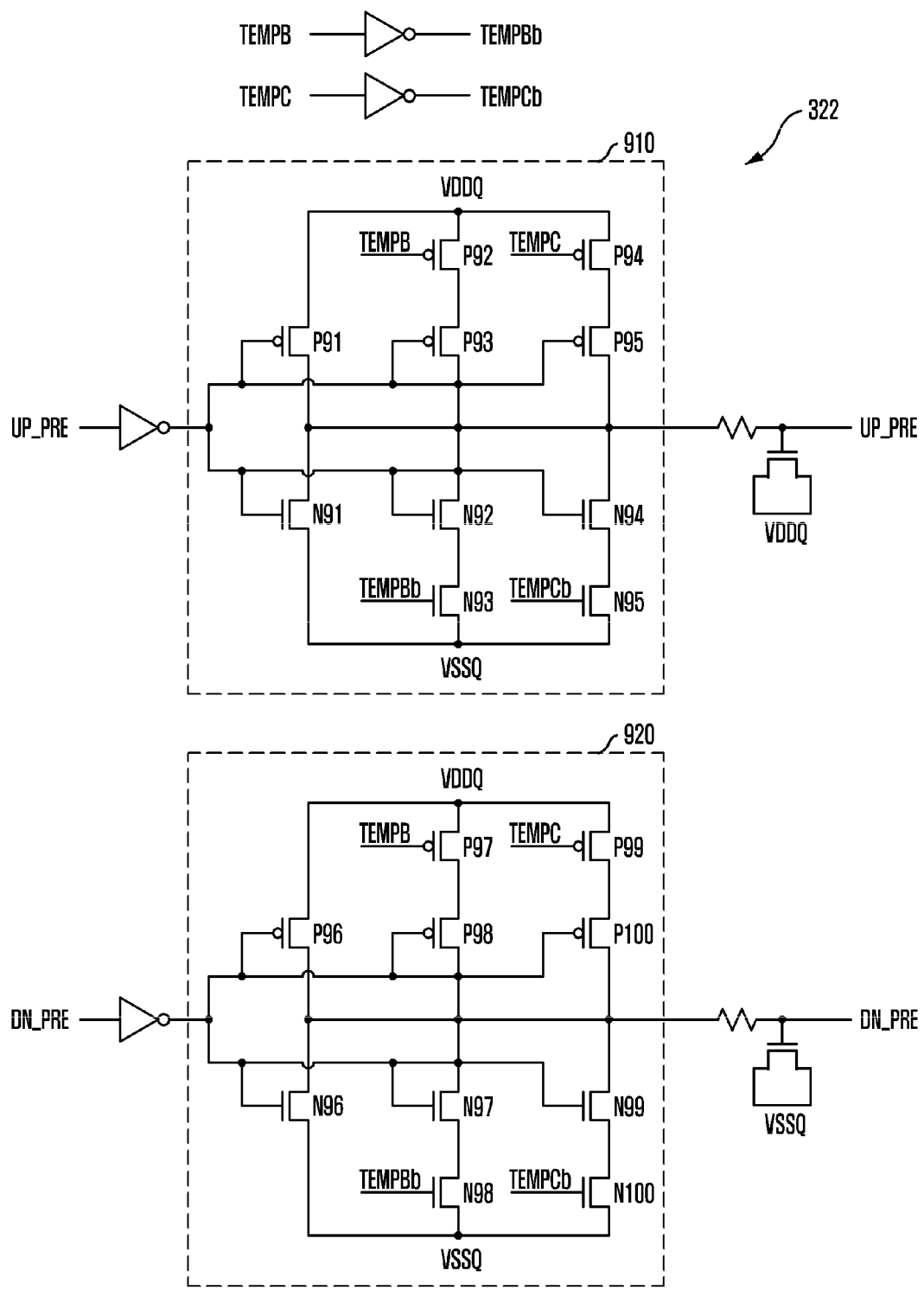
FIG. 9 is a circuit diagram of another modified example of the slew rate controller of FIG. 6.

FIG. 9 is a circuit diagram of another modified example of the slew rate controller 322 of FIG. 6.

Like the slew rate controller 322 of FIG. 8, a slew rate controller of FIG. 9 is designed to control the rising/falling properties of the driving control signals UP_PRE and DN_PRE by controlling the drivability of the driving control signals UP_PRE and DN_PRE. However, while the slew rate controller of FIG. 8 increases the slew rate as the temperature increase, the slew rate controller of FIG. 9 reduces the slew rate as the temperature increases.

Therefore, in the slew rate controller of FIG. 9, the flag signals (temperature information) are inversely input (i.e., TEMPBb instead of TEMPB, TEMPB instead of TEMPBb, TEMPCb instead of TEMPC, and TEMPC instead of TEMPCb).

Since the operation of the slew rate controller of FIG. 9 is same as that of the slew rate controller of FIG. 8 except for the slew rate is lowered as the temperature increases due to the inverse input of the temperature information, a detailed description thereof will be omitted herein. Each of the inverters 910 and 920 includes a plurality of transistors P91-P100, N91-N100

Figure 10:
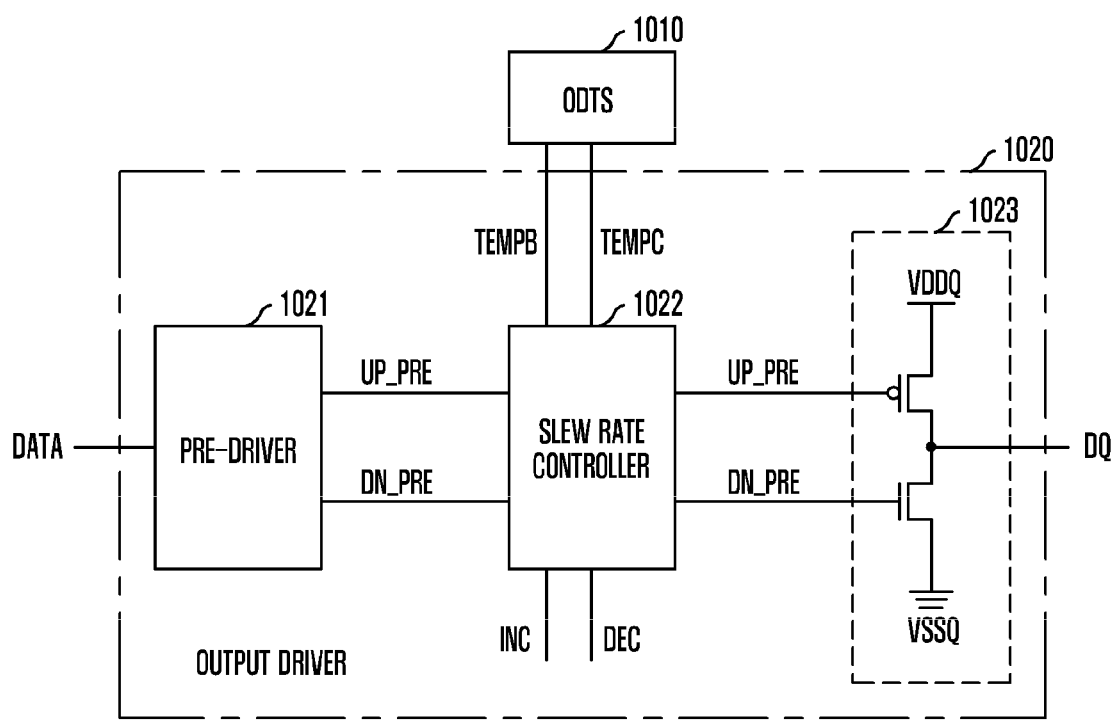
FIG. 10 is a block diagram of a semiconductor device in accordance with another embodiment of the invention.

FIG. 10 is a block diagram of a semiconductor device in accordance with another embodiment of the invention.

A semiconductor device of this embodiment includes an ODTS 1010 detecting an internal temperature of the semiconductor device and outputting temperature information TEMPB and TEMPC and an output driver 1020 receiving the temperature information TEMPB and TEMPC, controlling a slew rate such that the slew rate increases in proportion or inverse proportion to the temperature in accordance with setting information, and outputting data. The ODTS 1010 detects the internal temperature of the semiconductor device and outputs the temperature information TEMPB and TEMPC. The ODTS 1010 is already described in detail with reference to FIGS. 4 and 5, a detailed description thereof will be omitted herein.

The output driver 1020 controls a slew rate depending on the temperature information TEMPB and TEMPC and outputs the data DATA. When the output driver 323 of FIG. 3 is designed such that the slew rate increases in proportion to the temperature, the slew rate always increases in proportion to the temperature (see FIGS. 6 and 8), and when designed such that the slew rate increases in inverse proportion to the temperature, the slew rate always increases in inverse proportion to the temperature (see FIGS. 7 and 9). In this embodiment, the output driver 1020, however, is designed to control a slew rate such that the slew rate increases in proportion or inverse proportion to the temperature in accordance with the setting information.

The setting information is information for making the slew rate in proportion or inverse proportion to the temperature. In this embodiment, the setting information includes two signals INC and DEC. When the signal INC is activated, the output driver 1020 controls the slew rate such that the slew rate increases in proportion to the temperature. When the signal DEC is activated, the output driver 1020 controls the slew rate such that the slew rate increases in inverse proportion to the temperature. The signals (setting information) INC and DEC are set by a mode register setting (MRS), a fuse cutting of a fuse circuit, and the like. The semiconductor device of this embodiment has an advantage that it can be applied to a system where the slew rate is in proportion to the temperature as well as to a system where the sew rate is in inverse proportion to the temperature.

The output driver 1020 includes a pre-driver 1021 generating the driving control signals UP_PRE and DN_PRE in accordance with a logic level of the data, a slew rate controller 1022 controlling rising/falling properties of the driving control signals UP_PRE and DN_PRE such that the slew rate increases as the temperature increases when the signals (the setting information) INC and DEC are set to be proportional to the temperature and is reduced as the temperature increases when the signals (the setting information) INC and DEC are set to be inversely proportional to the temperature, and a main driver 1023 outputting data in response to the driving control signals UP_PRE and DN_PRE.

Since the pre-driver 1021 and the main driver 1023 are same as those of FIG. 3, a detailed description thereof will be omitted herein.

Figure 11:
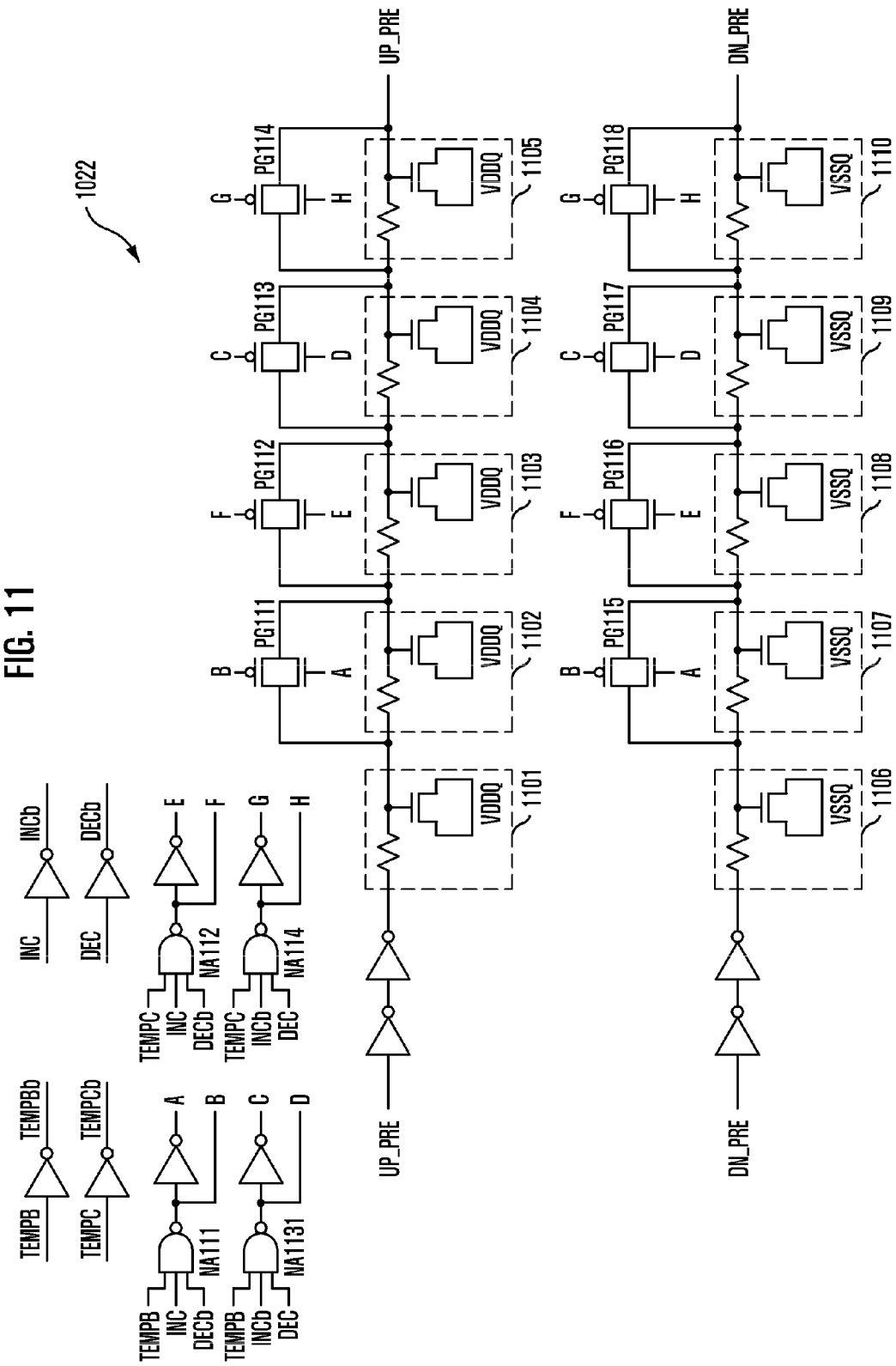
FIG. 11 is a circuit diagram of a slow rate controller of FIG. 10.

FIG. 11 is a circuit diagram of the slew rate controller 1022 of FIG. 10.

The slew rate controller 1022 varies the rising/falling properties of the driving control signals UP_PRE and DN_PRE by controlling delay values of the driving control signals UP_PRE and DN_PRE. The slew rate controller 1022 includes one or more delay units 1101-1110. When the setting information is set to be proportional to the temperature (INC="high" and DEC="low"), the slew rate controller 1022 increases the number of the delay units through which the driving control signals UP_PRE and DN_PRE pass as the temperature increases. When the setting information is set to be inversely proportional to the temperature (INC="low" and DEC="high"), the slew rate controller 1022 reduces the number of the delay units through which the driving control signals UP_PRE and DN_PRE pass as the temperature increases. INCb and DECb are the inverted values of INC and DEC respectively.

In more detail, the delay units 1101-1110 may be classified into a first group including the delay units 1102, 1103, 1107 and 1108 that operate when the setting information is set to be proportional to the temperature (INC="high" and DEC="low") and a second group including the delay units 1104, 1105, 1109 and 1110 that operate when the setting information is set to be inversely proportional to the temperature (INC="low" and DEC="high").

An operation of the slew rate controller will be described below in detail.

A case where the setting information is set to be proportional to the temperature (INC="high" and DEC="low") will be first described. When the signal (setting information) DEC having the low logic level is input to NAND gates NA113 and NA114, regardless of logic levels of other signals, outputs C, D, G and H of the NAND gates NA113 and NA114 respectively have the logic "low," "high," "low," and "high" levels. Then, pass gates PG113, PG114, PG117 and PG118 are turned on. Therefore, when the setting information is set to be proportional to the temperature, the driving control signals UP_PRE and DN_PRE do not pass through the delay units 1104, 1105, 1109 and 1110.

Logic values of outputs A, B, E and F of the NAND gates NA111 and NA112 are varied depending on the flag signals (temperature information) TEMPB and TEMPC. When the temperature is low (TEMPB="low" and TEMPC="low"), the outputs A, B, E and F of the NAND gates NA111 and NA112 respectively have the logic "low," "high," "low," and "high" levels. Therefore, the driving control signals UP_PRE and DN_PRE pass through the delay units 1102, 1103, 1107 and 1108 (since the delay units 1101 and 1106 are designed to allow the driving control signals UP_PRE and DN_PRE to always pass therethrough, they will not be specifically mentioned herein). When the temperature is intermediate (TEMPB="high" and TEMPC="low"), the outputs A, B, E and F of the NAND gates NA111 and NA112 respectively have the logic "high," "low," "low," and "high" levels to turn on pass gate PG111 and PG115. Therefore, the driving control signals UP_PRE and DN_PRE do not pass through the delay units 1102 and 1107. When the temperature is high (TEMPB="high" and TEMPC="high"), the outputs A, B, E and F of the NAND gates NA111 and NA112 respectively have the logic "high," "low," "high," and "low" levels to turn on the pass gates PG111, PG115, PG112 and PG116. Therefore, the driving control signals UP_PRE and DN_PRE do not pass through the delay units 1102, 1103, 1107 and 1108.

That is, when the signals (setting information) INC and DEC are set to be proportional to the temperature, the number of the delay units through which the driving control signals UP_PRE and DN_PRE pass is reduced as the temperature increases. Therefore, the slew rate of the main driver 1023 increases as the temperature increases.

A case where the setting information is set to be inversely proportional to the temperature (INC="low" and DEC="high") will be described. When the signal (setting information) INC having the logic low level is input to NAND gates NA111 and NA112, regardless of logic levels of other signals, outputs A, B, E and F of the NAND gates NA111 and NA112 respectively have the logic "low," "high," "low," and "high" levels to turn off the pass gates PG111, PG112, PG115 and PG116. Therefore, the driving control signals UP_PRE and DN_PRE pass through the delay units 1102, 1103, 1107 and 1108. When the temperature is low (TEMPB="low" and TEMPC="low"), the pass gates PG113, PG114, PG117 and PG118 are turned on so that the driving control signals UP_PRE and DN_PRE do not pass the delay units 1104, 1105, 1109 and 1110. As the temperature increases, levels of the flag signals (temperature information) TEMPB and TEMPC are varied and thus levels of signals of the outputs C, D, G and H are varied. Therefore, the pass gates PG113, PG114, PG115 and PG116 are turned off. Therefore, the number of the delay units through which the driving control signals UP_PRE and DN_PRE pass gradually increases.

That is, when the signals (setting information) INC and DEC are set to be inversely proportional to the temperature, the number of the delay units through which the driving control signals UP_PRE and DN_PRE pass increases as the temperature increases.

According to the slew rate controller of FIG. 11, at the same low temperature, the number of the delay units through which the driving control signals UP_PRE and DN_PRE pass when the setting information INC and DEC is set to be proportional to the temperature is greater than the number of the delay units through which the driving control signals UP_PRE and DN_PRE pass when the setting information INC and DEC is set to be inversely proportional to the temperature. Since the setting information INC and DEC are set to be inversely proportional to the temperature when the slew rate is marginal, this does not significantly affect the semiconductor device.

Figure 12:
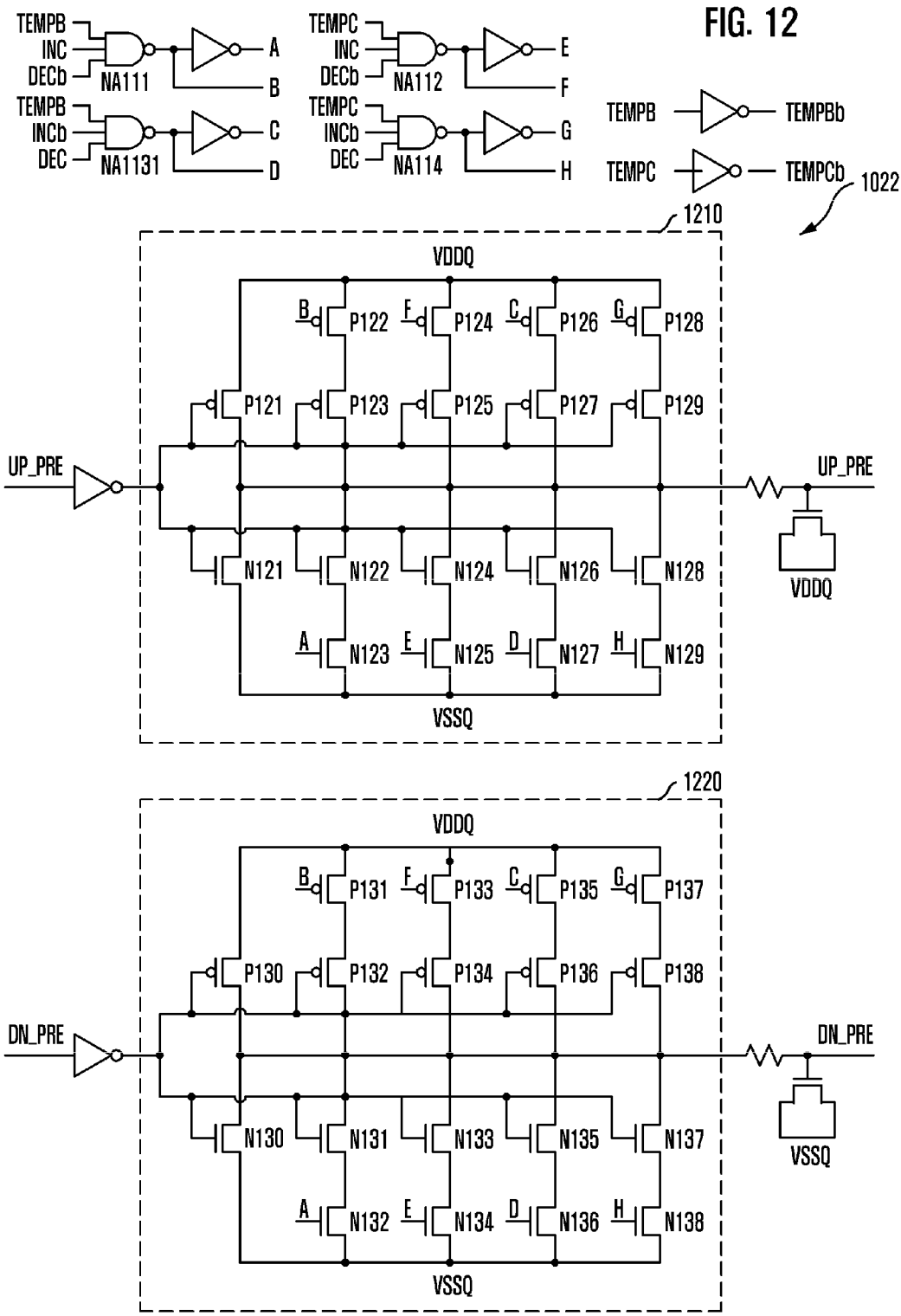
FIG. 12 is a circuit diagram of a modified example of the slow rate controller of FIG. 11.

FIG. 12 is a circuit diagram of a modified example of the slew rate controller 1022 of FIG. 11.

A slow rate controller of FIG. 12 is designed to control the rising/falling properties of the driving control signal UP_PRE and DN_PRE by controlling a drivability of the driving control signals UP_PRE and DN_PRE.

In this case, as shown in FIG. 12, the slew rate controller includes one or more logic gates 1210 and 1220 through which the driving control signals UP_PRE and DN_PRE pass and the drivability of the logic gates 1210 and 1220 is controlled by the temperature information TEMPB and TEMPC and the setting information INC and DEC. In FIG. 12, inverters are exemplarily illustrated as the logic gates 1210 and 1220.

In more detail, each of the inverters 1210 and 1220 includes a plurality of transistors P121-P138, N121-N138 that are connected in parallel. The number of the transistors used is determined depending on the temperature information TEMPB and TEMPC to control the drivability of the driving control signals UP_PRE and DN_PRE. The setting information INC and DEC determines the transistors that will be controlled depending on the temperature information TEMPB and TEMPC in a specific setting.

An operation of the slew rate controller of FIG. 12 will be described below in detail.

A case where the setting information is set to be proportional to the temperature (INC="high" and DEC="low") will be first described. When the signal (setting information) DEC having the logic low level is input to NAND gates NA123 and NA124, regardless of logic levels of other signals, outputs C, D, G and H of the NAND gates NA113 and NA114 respectively have the logic "low," "high," "low," and "high" levels. Therefore, the transistors P126, P128, P135, P137, N127, N129, N136 and N138 are turned on to pull up and pull down the driving control signals UP_PRE and DN_PRE. When the temperature is low (TEMPB="low" and TEMPC="low"), the outputs A, B, E and F respectively have the logic "low," "high," "low," and "high" levels to turn off the transistors P122, P124, P131, P133, N123, N125, N132 and N134. Therefore, the driving control signals UP_PRE and DN_PRE are not driven. As the temperature gradually increases, logic levels of signals of the outputs A, B, C and D are varied to turn on the transistors P122, P124, P131, P133, N123, N132 and N134. Therefore, the driving control signals UP_PRE and DN_PRE are gradually driven.

That is, when the signals (setting information) INC and DEC are set to be proportional to the temperature, the number of the transistors by which the driving control signals UP_PRE and DN_PRE are driven gradually increases as the temperature increases. Therefore, the slew rate of the main driver 1023 increases as the temperature increases.

A case where the setting information is set to be inversely proportional to the temperature (INC="low" and DEC="high") will be described. When the signal (setting information) INC having the logic low level is input to NAND gates NA121 and NA122, regardless of logic levels of other signals, the outputs A, B, E and F of the NAND gates NA121 and NA122 respectively have the logic "low," "high," "low," and "high" levels to turn off the transistors P122, P124, P131, P133, N133, N123, N125, N132, N134. Therefore, the driving control signals UP_PRE and DN_PRE are not driven. When the temperature is low (TEMPB="low" and TEMPC="low"), the outputs C, D, G and H respectively having the logic "low," "high," "low," and "high" levels to turn on the transistors P126, P128, P135, P137, N127, N129, N136 and N138. However, as the temperature increases, the transistors P126, P128, P135, P137, N127, N129, N136 and N138 are turned off and thus the driving control signals UP_PRE and DN_PRE are not driven. As a result, the slew rate of the main driver 1023 is reduced.

That is, when the signals (setting information) INC and DEC are set to be inversely proportional to the temperature, the number of the transistors by which the driving control signals UP_PRE and DN_PRE are driven is reduced as the temperature increases and thus the slew rate of the main driver 1023 is lowered.

According to the slew rate controller of FIG. 12, at the same low temperature, the number of the transistors by which the driving control signals UP_PRE and DN_PRE are driven when the setting information INC and DEC is set to be proportional to the temperature is greater than the number of the transistors by which the driving control signals UP_PRE and DN_PRE are driven when the setting information INC and DEC is set to be inversely proportional to the temperature.

Since the setting information INC and DEC are set to be inversely proportional to the temperature when the slew rate is marginal, this does not significantly affect the semiconductor device.

A data outputting method of the semiconductor device in accordance with an embodiment of the invention will be described below with reference to FIG. 3 to 12.

A data outputting method of the semiconductor device includes generating the temperature information TEMPB and TEMPC by detecting the internal temperature of the semiconductor device (refer to the description of FIGS. 4 and 5), generating the one or more driving control signals UP_PRE and DN_PRE in accordance with the logic levels of the data DATA (refer to the description on the slew rate controller of FIG. 3), controlling rising/falling properties of the driving control signals UP_PRE and DN_PRE in accordance with the temperature information TEMPB and TEMPC, and pulling up or pulling down the input/output node DQ in response to the driving control signals UP_PRE and DN_PRE whose rising/falling properties are controlled (refer to the description on the main driver of FIG. 3).

The rising/falling properties of the driving control signals UP_PRE and DN_PRE may be controlled by controlling the delay values of the driving control signals UP_PRE and DN_PRE (refer to the description of FIGS. 6 and 7).

Alternatively, the rising/falling properties of the driving control signals UP_PRE and DN_PRE are controlled by controlling the pull-up drivability and pull-down drivability of the driving control signals UP_PRE and DN_PRE (refer to the description of FIGS. 8 and 9).

In the semiconductor device in accordance with the embodiments of the invention, the slew rate of the output driver is controlled depending on the temperature information from the temperature information output unit. At this point, the slew rate may be controlled in proportion or inverse proportion to the temperature.

When the output driver controls its own slew rate such that the slew rate increases in proportion to the temperature, the output driver can stably output the data with a uniform slew rate as it controls the slew rate such that the slew rate increases even when the slew rate decreases due to property degradation caused by the variation of the temperature.

When the output driver controls its own slew rate such that the slew rate increases in inverse proportion to the temperature, the slew rate is further reduced as the temperature increases. When the temperature increases, current consumption of the semiconductor device increases. In this case, by reducing the slew rate as the temperature increases, the current consumption can be reduced. When the semiconductor device is applied to a low-speed system, the slew rate is not an importance factor since a data window can be sufficiently obtained. Therefore, when the current consumption of the semiconductor device increases at the high temperature, the current consumption can be reduced by lowering the slew rate.

In accordance with the embodiments of the invention, the output driver has both a function for controlling the slew rate in proportion to the temperature and a function for controlling the slew rate in inverse proportion to the temperature and one of the functions can be selected in accordance with a setting value. When the speed and stability are top priority of the output driver, the output driver is set such that the slew rate increases in proportion to the temperature. When the reduction of the current consumption is priority of the output drive, the output driver is set such that the slew rate increases in inverse proportion to the temperature.

In this case, since it is possible to change a slew rate property depending on the temperature by changing the setting value, the semiconductor device can be applied to a high-speed system as well as a low-speed system.

While the invention has been described with respect to the specific embodiments, it will be apparent to those skilled in the art that various changes and modifications may be made without departing from the spirit and scope of the invention as defined in the following claims.

Although it is described in the present disclosure that the output driver outputs the data DATA, the terminology "data" is simply used to represent a variety of signals (information) with "high" and "low" that are output from a chip of the semiconductor device. Therefore, the present disclosure is not limited to the terminology "data."

What is claimed is:

1. A semiconductor device, comprising;
   a thermal sensor configured to output temperature information; and
   an output driver configured to output data and including a slew rate controller which controls a slew rate depending on the temperature information,
   wherein the slew rate controller includes at least one delay unit, and the number of the delay units through which a driving control signal passes is controlled based on the temperature information.

2. The semiconductor device as recited in claim 1, wherein the output driver further includes;
   a pre-driver configured to generate the driving control signal in accordance with a logic level of the data;
   a main driver configured to output the data in response to the driving control signal from the slew rate controller.

3. The semiconductor device as recited in claim 2, wherein the slew rate controller is configured to output the driving control signal after controlling a rising/falling property of the driving control signal depending on the temperature information.

4. The semiconductor device as recited in claim 1, wherein the at least one delay unit includes a resistor and a capacitor.

5. The semiconductor device as recited in claim 1, wherein the output driver is configured to control the slew rate such that the slew rate increases as the internal temperature increases.

6. The semiconductor device as recited in claim 1, wherein the output driver is configured to control the slew rate such that the slew rate increases as the internal temperature decreases.

7. The semiconductor device as recited in claim 1, wherein the temperature information includes at least one flag signal to be enabled at or above a predetermined temperature.

8. The semiconductor device as recited in claim 1, wherein the thermal sensor is an on die thermal sensor (ODTS) configured to output the temperature information based upon a detected internal temperature of the semiconductor device.

9. A semiconductor device, comprising:
an ODTS configured to detect an internal temperature of the semiconductor device and output temperature information; and
an output driver configured to output data and including a slew rate controller which receives the temperature information, and controls a slew rate such that the slew rate increases in proportion or inverse proportion to the temperature in accordance with setting information,
wherein the slew rate controller includes at least one delay unit, the number of the delay units through which a driving control signal passes is reduced as the temperature increases when the setting information is set to be proportional to the temperature, and the number of the delay units through which the driving control signal passes increases as the temperature increases when the setting information is set to be inversely proportional to the temperature.

10. The semiconductor device as recited in claim 9, wherein the output driver further comprises:
a pre-driver configured to generate at least one driving control signal in accordance with a logic level of the data; and
a main driver configured to output the data in response to the driving control signal from the slew rate controller.

11. The semiconductor device as recited in claim 10, wherein the slew rate controller is configured to output the driving control signal after controlling a rising/falling property of the driving control signal depending on the temperature information.

12. The semiconductor device as recited in claim 9, wherein the setting information is determined in accordance with whether a mode resistor is set or whether a fuse circuit is cut.

13. A data outputting method of a semiconductor device, the data outputting method comprising:
generating temperature information by detecting an internal temperature of the semiconductor device and outputting data;
generating at least one driving control signal in accordance with a logic level of the data;
controlling a rising/falling property of the driving control signal depending on the temperature information; and
pulling up or pulling down a voltage of an input/output node in response to the driving control signal whose rising/falling property is controlled,
wherein the rising/falling property of the driving control signal is controlled by at least one delay unit, and the number of the delay units through which the driving control signal passes is controlled based on the temperature information.

14. A semiconductor device, comprising;
a thermal sensor configured to output temperature information; and
an output driver configured to output data and including a slew rate controller which controls a slew rate depending on the temperature information,
wherein the slew rate controller includes at least one logic gate through which a driving control signal passes, the at least one logic gate includes a plurality of transistors connected in parallel, and the number of the transistors is determined according to the temperature information.

15. The semiconductor device as recited in claim 14, wherein the output driver further includes;
a pre-driver configured to generate the driving control signal in accordance with a logic level of the data; and
a main driver configured to output the data in response to the driving control signal from the slew rate controller.

16. A semiconductor device, comprising:
an ODTS configured to detect an internal temperature of the semiconductor device and output temperature information; and
an output driver configured to output data and including a slew rate controller which receives the temperature information, and controls a slew rate such that the slew rate increases in proportion or inverse proportion to the temperature in accordance with setting information,
wherein the slew rate controller includes at least one logic gate through which a driving control signal passes, drivability of the at least one logic gate increases as the temperature increases when the setting information is set to be proportional to the temperature, and drivability of the at least one logic gate is reduced as the temperature increases when the setting information is set to be inversely proportional to the temperature.

17. The semiconductor device as recited in claim 16, wherein the logic gate includes a plurality of transistors connected in parallel and the number and drivability of the transistors used is controlled according to the temperature information.

18. The semiconductor device as recited in claim 16, wherein the output driver further includes;
a pre-driver configured to generate the driving control signal in accordance with a logic level of the data; and
a main driver configured to output the data in response to the driving control signal from the slew rate controller.

19. A data outputting method of a semiconductor device, the data outputting method comprising:
generating temperature information by detecting an internal temperature of the semiconductor device and outputting data;
generating at least one driving control signal in accordance with a logic level of the data;
controlling a rising/falling property of the driving control signal depending on the temperature information; and
pulling up or pulling down a voltage of an input/output node in response to the driving control signal whose rising/falling property is controlled,
wherein the rising/falling property of the driving control signal is controlled by at least one transistor, and the number of transistors through which the driving control signal passes is controlled based on the temperature information.

* * * * *